United States Patent
Avouris et al.

(10) Patent No.: US 8,530,886 B2
(45) Date of Patent: Sep. 10, 2013

(54) NITRIDE GATE DIELECTRIC FOR GRAPHENE MOSFET

(75) Inventors: Phaedon Avouris, Yorktown Heights, NY (US); Deborah A. Neumayer, Danbury, CT (US); Wenjuan Zhu, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 139 days.

(21) Appl. No.: 13/051,707

(22) Filed: Mar. 18, 2011

(65) Prior Publication Data

US 2012/0235118 A1    Sep. 20, 2012

(51) Int. Cl.
*H01L 29/12* (2006.01)
(52) U.S. Cl.
USPC .............. 257/29; 257/E51.006; 257/E51.038; 977/938
(58) Field of Classification Search
USPC ............................. 257/29; 977/938, 755, 936
See application file for complete search history.

(56) References Cited

U.S. PATENT DOCUMENTS

| 7,687,308 | B2 | 3/2010 | Parikh et al. |
| 7,732,859 | B2 | 6/2010 | Anderson et al. |
| 2009/0169919 | A1 | 7/2009 | Garcia et al. |
| 2009/0294759 | A1 | 12/2009 | Woo et al. |
| 2010/0006823 | A1 | 1/2010 | Anderson et al. |
| 2010/0025660 | A1 | 2/2010 | Jain et al. |
| 2010/0055464 | A1 | 3/2010 | Sung |
| 2010/0090759 | A1 | 4/2010 | Shin et al. |
| 2010/0301336 | A1* | 12/2010 | Babich et al. ............... 257/57 |
| 2011/0101365 | A1* | 5/2011 | Kim et al. .................. 257/66 |
| 2011/0114919 | A1* | 5/2011 | Jenkins et al. .............. 257/29 |
| 2012/0049161 | A1* | 3/2012 | Dimitrakopoulos et al. ... 257/29 |
| 2012/0085991 | A1* | 4/2012 | Cohen et al. ................ 257/28 |

FOREIGN PATENT DOCUMENTS

JP    2009143761    7/2009

OTHER PUBLICATIONS

Pezoldt et al., "Top gated graphene transistors with different gate insulators", Published online Nov. 11, 2009, Phys. Status Solidi C7, No. 2, p. 390-393.*
Prosecution History, PCT/US12/28172, International Search Report and Written Opinion, Jun. 22, 2012.

* cited by examiner

*Primary Examiner* — Calvin Lee
*Assistant Examiner* — Scott Stowe
(74) *Attorney, Agent, or Firm* — Law Offices of Ira D. Blecker, P.C.

(57) ABSTRACT

A semiconductor structure which includes a substrate; a graphene layer on the substrate; a source electrode and a drain electrode on the graphene layer, the source electrode and drain electrode being spaced apart by a predetermined dimension; a nitride layer on the graphene layer between the source electrode and drain electrode; and a gate electrode on the nitride layer, wherein the nitride layer is a gate dielectric for the gate electrode.

26 Claims, 3 Drawing Sheets

NITRIDE GATE DIELECTRIC FOR GRAPHENE MOSFET

This invention was made with Government support under Contract Number FA8650-08-C-7838 awarded by the Defense Advanced Research Projects Agency (DARPA). The Government has certain rights to this invention.

BACKGROUND

The present invention relates to semiconductor structures and, more particularly, relates to semiconductor structures including graphene and a nitride gate dielectric.

Semiconductor devices are used in a variety of electronic applications, such as personal computers, cell phones, digital cameras, and other electronic equipment, as examples. Semiconductor devices are typically fabricated by sequentially depositing insulating (or dielectric) layers, conductive layers, and insulating layers of material over a semiconductor substrate, and patterning the various layers using lithography to form circuit components and elements thereon.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET).

Graphene is very promising for analog high-frequency circuits due to its high intrinsic mobility. Graphene typically refers to a single planar sheet of covalently bonded carbon atoms. In essence, graphene is an isolated atomic plane of graphite. Graphene is believed to be formed of a plane of carbon atoms that are $sp^2$-bonded carbon to form a regular hexagonal lattice with an aromatic structure. The thickness of graphene is one atomic layer of carbon. That is, graphene does not form a three-dimensional crystal. However, multiple sheets of graphene may be stacked. A typical graphene "layer" may include a single sheet or multiple sheets of graphene.

BRIEF SUMMARY

The various advantages and purposes of the exemplary embodiments as described above and hereafter are achieved by providing, according to a first aspect of the exemplary embodiments, a semiconductor structure. The semiconductor structure includes a substrate; a graphene layer on the substrate; a source electrode and a drain electrode on the graphene layer, the source electrode and drain electrode being spaced apart by a predetermined dimension; a nitride layer on the graphene layer between the source electrode and drain electrode; and a gate electrode on the nitride layer, wherein the nitride layer is a gate dielectric for the gate electrode.

According to a second aspect of the exemplary embodiments, there is provided a method of forming a semiconductor structure. The method includes providing a substrate; forming a graphene layer on the substrate; depositing a nitride layer on the graphene layer; forming a source electrode and a drain electrode on the graphene layer, the source electrode and drain electrode being spaced apart by a predetermined dimension, the nitride layer extending at least part of the predetermined dimension between the source electrode and drain electrode; and forming a gate electrode on the nitride layer, wherein the nitride layer is a gate dielectric for the gate electrode.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION

While it would be desirable to use graphene for applications such as analog high-frequency circuits, it is very difficult to deposit gate dielectrics on the graphene due to its hydrophobic nature. Given that a perfect graphene surface is chemically inert, direct growth of high dielectric constant (high-k) gate insulators such as $Al_2O_3$ and $HfO_2$ by atomic layer epitaxy (ALD) on a clean graphite surface usually leads to discontinuous films, where the dielectrics preferably grow on steps or defect sites which serve as nucleation centers. Surface pretreatments, such as exposure to $NO_2$, PTCA (carboxylate-terminated perylene) or ozone may improve the adhesion of the film, however these pretreatments usually severely degrade the graphene channel mobility. In addition, since graphene is very easily oxidized, especially in the oxygen containing ambient used to deposit high-k oxide dielectrics, the high-k oxide dielectric is usually deposited at low temperature which may cause high trapped charges in the high-k oxide gate dielectric and mobility degradation in the channel.

It is proposed in the exemplary embodiments to deposit a nitride film, such as aluminum nitride, silicon nitride, hafnium nitride or zirconium nitride, on the underlying graphene to be used as the gate dielectric. An advantage of using the nitride film is that it can be synthesized in an oxygen-free ambient. In this inert ambient, higher temperatures and/or plasma can be applied, which results in better adhesion of the dielectrics on the graphene and a higher quality of the gate dielectrics with less trapped charges. This can enable graphene devices with higher yield and higher performance.

Figure 1:
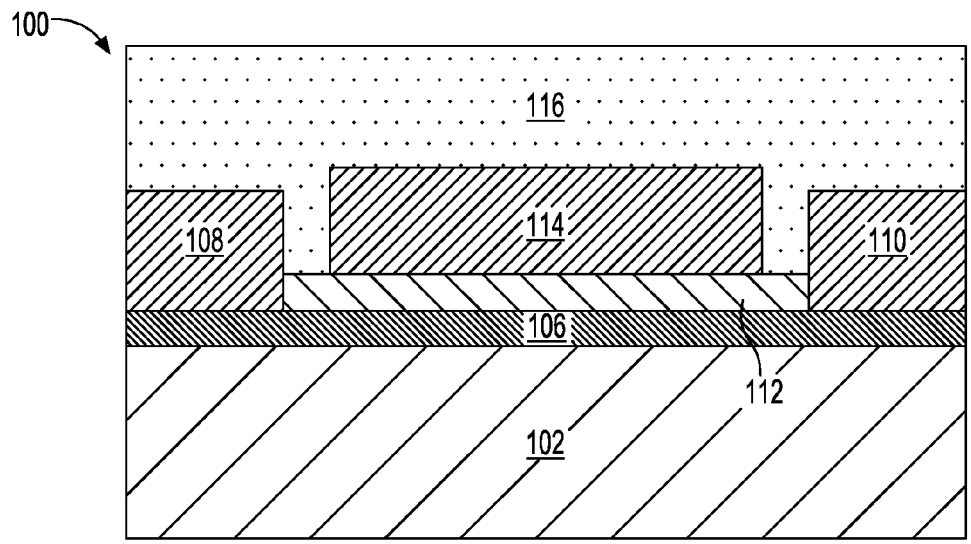
FIG. 1 is a cross sectional view of a first exemplary embodiment of a semiconductor structure having a graphene layer on a substrate.

Referring now to FIG. 1, there is shown a first exemplary embodiment of a semiconductor structure 100. The semiconductor structure 100 includes a substrate 102. The substrate 102 may be, without limitation, selected from the following substrates: semiconductor substrates such as silicon, silicon carbide, silicon germanium, germanium, III-V compound, or a II-VI compound; insulator substrates such as quartz and sapphire; polymer substrates such as polyethylene terephthalate (PET) film; layered substrates such as $SiO_2/Si$, $HfO_2/Si$, $Al_2O_3/Si$, SOI (silicon on insulator); or combinations of any of the foregoing types of substrates.

On top of the substrate is formed graphene layer(s) 106. As noted above, a single layer of graphene has a thickness equal to one atomic layer of carbon. It is preferable that there be 10 layers or less of graphene and more preferably less than 5 layers of graphene. Ideally, there should be just 1 or 2 layers of graphene.

A nitride film 112 is deposited on the graphene in an oxygen-free atmosphere. The nitride film 112 should have a thickness of about 2 to 20 nanometers. The nitride film 112 may be made from a nitride such as aluminum nitride, silicon nitride, hafnium nitride or zirconium nitride. The nitride film 112 will be the gate dielectric for a subsequently deposited gate electrode.

The semiconductor structure 100 further includes a gate electrode 114, a source electrode 108 and a drain electrode 110. The gate electrode 114 may be deposited and patterned before or after the deposition and patterning of the source electrode 108 and drain electrode 110. The materials for the gate electrode 114, source electrode 108 and drain electrode 110 may include, but not be limited to, titanium, palladium, gold, polysilicon, titanium nitride, aluminum and combinations of these metals.

It is noted that in this exemplary embodiment, the nitride film 112 extends entirely between the source electrode 108 and drain electrode 110 and underneath the gate electrode 114.

An insulating interlevel dielectric material 116 such as an oxide may be deposited over the semiconductor structure 100. Thereafter, further processing to form contacts and back end of the line wiring layers may proceed to form a semiconductor device such as a metal oxide semiconductor field effect transistor (MOSFET).

Figure 2:
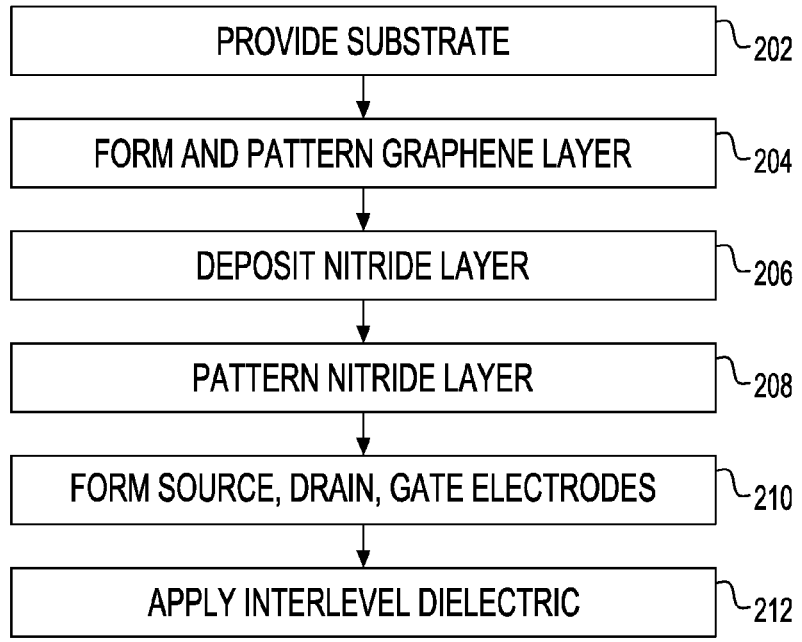
FIG. 2 is a process flow for forming the first exemplary embodiment in FIG. 1.

Referring now to FIG. 2, there is shown and described a process for forming the first exemplary embodiment.

In the process, a substrate such as those described previously is provided upon which a semiconductor circuit will be built, box 202.

Then, a graphene layer is formed on the substrate, box 204. The graphene layer may be formed on the substrate by a number of different ways. One way is to form single or multilayer graphene on a metal such as copper by a CVD process using $CH_4$ and $H_2$ or by ethylene. The graphene is then transferred to the substrate.

A second way of forming graphene on the substrate is by an exfoliation process. In the exfoliation process, an adhesive tape is used to repeatedly split graphite crystals into increasingly thinner pieces of graphene flakes and then transfer the graphene flakes onto the substrate.

A third way of forming graphene on the substrate is epitaxial growth on silicon carbide. A wafer of silicon carbide is heated to a very high temperature (for example, greater than about 1100° C.) to remove the silicon. What is left is a few layers (1 to 10 layers) of graphene on a silicon carbide substrate which in an exemplary embodiment may become the substrate of the semiconductor structure.

The above ways of forming graphene on the substrate are for purposes of illustration only and not limitation. There may be other ways, now in existence or in the future, of forming graphene on a substrate which are considered to be within the scope of the exemplary embodiments.

Then the graphene can be patterned by lithography and $O_2$ plasma etching.

The process continues by depositing a layer of nitride on the graphene, box 206. The nitride selected may be a nitride such as aluminum nitride, silicon nitride, hafnium nitride or zirconium nitride. The nitride is deposited in an oxygen-free atmosphere by a process such as sputtering, chemical vapor deposition (CVD), plasma enhanced chemical vapor deposition (PECVD), physical vapor deposition (PVD), jet vapor deposition (JVD) or atomic layer deposition (ALD). By oxygen-free it is meant that the atmosphere does not contain oxygen or ozone in other than trace amounts.

Aluminum nitride may be deposited by a CVD process using an aluminum precursor such as $AlCl_3(NH_3)$, $AlBr_3$, $AlMe_3$ or $Al(NMe_2)_3$, together with a nitrogen source such as ammonia (NH3) and/or nitrogen gas ($N_2$). Aluminum nitride may also be deposited by MBE (molecular beam epitaxy) using aluminum metal and nitrogen gas.

Silicon nitride may be deposited by a PECVD process using silane ($SiH_4$), ammonia and nitrogen or by Jet-Vapor-Deposition using $SiH_4$ and $N_2$.

Hafnium nitride may be deposited by sputtering hafnium in a nitrogen gas atmosphere. Hafnium nitride may also be deposited by CVD using $Hf(NEt_2)_4$ precursor and ammonia.

Zirconium nitride may be deposited by sputtering zirconium metal in a nitrogen gas atmosphere. Zirconium nitride may also be deposited by CVD using $Zr(NEt_2)_4$ precursor and ammonia.

The nitride film may then be annealed after deposition. The nitride may be annealed in a temperature range of 400 to 1000° C. The annealing may be done by a rapid thermal anneal process for 10 to 60 seconds or in a furnace for 10 to 60 minutes.

After deposition of the nitride layer, the nitride layer may be patterned, box 208. One process sequence may be to blanket deposit the nitride layer, block the nitride layer where it is to be retained with a photoresist and then removing the unblocked nitride layer with reactive ion etching or wet etch. The photoresist is then stripped.

The source electrode and drain electrode are then formed by a conventional process on the graphene and the gate electrode is formed by a conventional process on the nitride layer, box 210.

An interlevel dielectric, such as an oxide may then be deposited everywhere, box 212.

With the process flow as just described, the first exemplary embodiment illustrated in FIG. 1 may be obtained.

Figure 3:
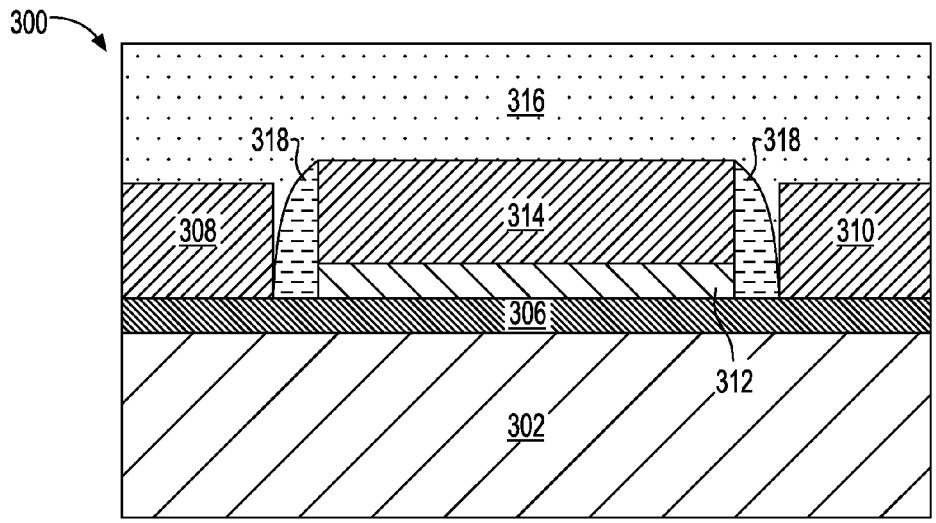
FIG. 3 is a cross sectional view of a second exemplary embodiment of a semiconductor structure having a graphene layer on a substrate.

Referring now to FIG. 3, there is shown a second exemplary embodiment of a semiconductor structure 300. The semiconductor structure 300 includes a substrate 302 and a graphene layer 306, a gate electrode 314, a source electrode 308, a drain electrode 310 and interlevel dielectric 316 as described in FIG. 1.

The semiconductor structure 300 includes a nitride layer 312 on the graphene layer 306. It is noted that in this exemplary embodiment, the nitride layer 312 may or may not cover the entire graphene channel. The semiconductor structure 300 further includes a spacer 318. The spacer 318 can be oxide, nitride or combination of those layers. Part of the graphene channel may be in direct contact with the spacer 318.

The substrate 302, nitride layer 312, gate electrode 314, source electrode 308 and drain electrode 310 may include any of the materials discussed with respect to the first exemplary embodiment in FIG. 1.

Figure 4:
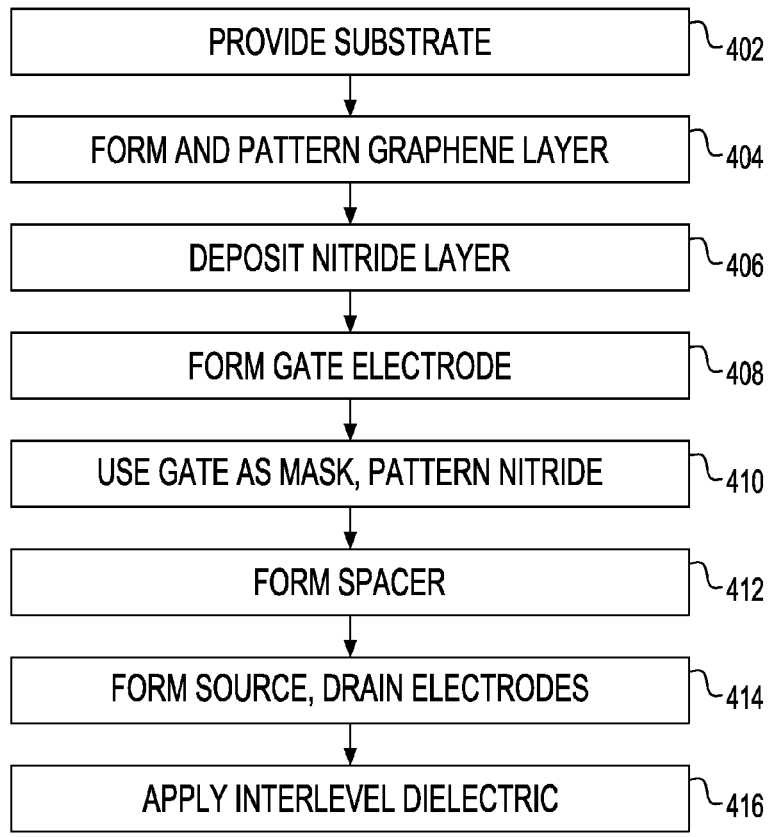
FIG. 4 is a process flow for forming the second exemplary embodiment in FIG. 3.

Referring now to FIG. 4, there is shown and described a process for forming the second exemplary embodiment in FIG. 3. In the process, a substrate is provided upon which a semiconductor circuit will be built, box 402.

A graphene layer is formed on the substrate, box 404, as described previously with respect to the first exemplary embodiment.

A nitride layer is deposited on the graphene in an oxygen-free atmosphere as described previously, box 406. Again, the nitride selected may be a nitride such as aluminum nitride, silicon nitride, hafnium nitride or zirconium nitride.

Then a gate electrode is formed on the nitride layer by a conventional process, box 408. A spacer may be formed on the gate electrode, box 412. In one exemplary embodiment, the nitride layer un-protected by the gate electrode (i.e., not covered by the gate electrode) may be etched away (patterned) before the spacer is formed, box 410. In this case, the nitride layer only extends directly underneath the gate electrode to form the gate dielectric. The spacer is added to cover part of the graphene channel. In another exemplary embodiment, etching of the gate electrode may be stopped on the nitride layer. That is, the nitride layer is not etched. Then a spacer is formed on the gate electrode and over the nitride layer. In this case, the nitride layer that forms the gate dielectric may cover the entire graphene channel between the source and drain electrodes.

The nitride layer at the contact area (where source and drain electrodes will be formed) is removed and source and drain electrodes are formed, box 414.

An insulating interlevel dielectric material may be deposited over the semiconductor structure 300, box 416.

With the process flow as just described, the second exemplary embodiment illustrated in FIG. 3 may be obtained.

Figure 5:
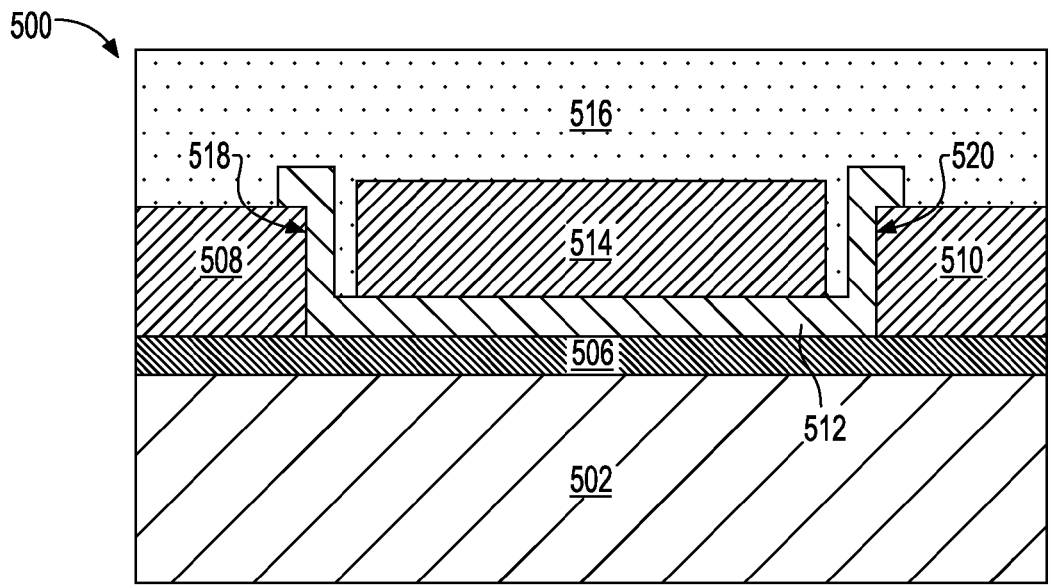
FIG. 5 is a cross sectional view of a third exemplary embodiment of a semiconductor structure having a graphene layer on a substrate.

Referring now to FIG. 5, there is shown a third exemplary embodiment of a semiconductor structure 500. The semiconductor structure 500 includes a substrate 502, a graphene layer 506, a gate electrode 514, a source electrode 508, a drain electrode 510 and interlevel dielectric 516, as described previously in FIG. 1.

The semiconductor structure 500 includes a nitride layer 512 on the graphene layer 506. It is noted that in this exemplary embodiment, the nitride layer 512 may cover the entire graphene channel between the source electrode 508 and drain electrode 510. In addition, the nitride layer 512 may also cover a sidewall 518 of the source electrode 508 and a sidewall 520 of the drain electrode 510.

The substrate 502, nitride layer 512, gate electrode 514, source electrode 508 and drain electrode 510 may include any of the materials discussed with respect to the first exemplary embodiment in FIG. 1.

Figure 6:
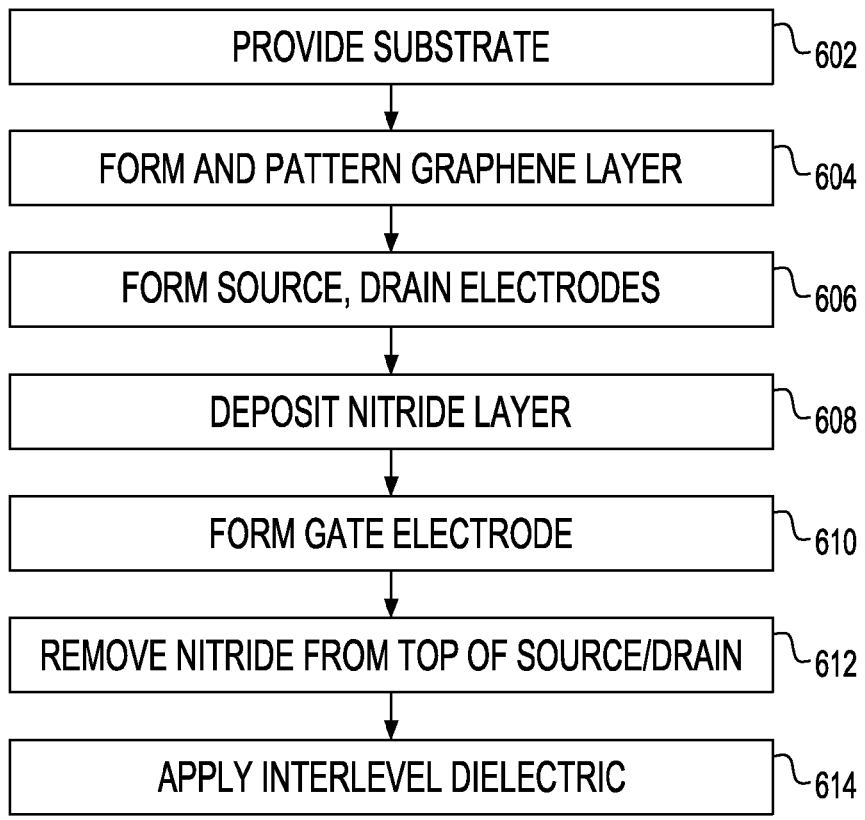
FIG. 6 is a process flow for forming the third exemplary embodiment in FIG. 5.

Referring now to FIG. 6, there is shown and described a process for forming the third exemplary embodiment in FIG. 5. In the process, a substrate is provided upon which a semiconductor circuit will be built, box 602.

A graphene layer is deposited by any of the techniques described previously and patterned on the substrate, box 604.

The source and drain electrodes may be formed by lithography and lift-off or reactive ion etching (RIE), box 606.

A nitride layer may be deposited on the substrate in an oxygen-free atmosphere as described previously, box 608. The nitride layer may cover the graphene channel and the side and top of the source and drain electrodes. Again, the nitride selected may be a nitride such as aluminum nitride, silicon nitride, hafnium nitride or zirconium nitride.

A gate electrode may be formed on the nitride layer, box 610. The nitride layer forms the gate dielectric for the gate electrode. The nitride layer on top of the source and drain electrodes may be optionally removed by RIE or wet etch, box 612.

An insulating interlevel dielectric material such as an oxide may be deposited over the semiconductor structure 500, box 614.

With the process flow as just described, the third exemplary embodiment illustrated in FIG. 5 may be obtained.

After the processing described in FIGS. 2, 4 and 6, further conventional processing to form contacts and back end of the line wiring layers may proceed hereafter to form a semiconductor device such as a MOSFET. It is to be understood that the semiconductor structure 100, 300 or 500 forms only a part of a MOSFET and that there will be a plurality of semiconductor structures 100, 300 and 500 in the finished MOSFET.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of forming a semiconductor structure comprising:
    providing a substrate;
    forming a graphene layer on the substrate;
    depositing a nitride layer on the graphene layer;
    forming a source electrode and a drain electrode on the graphene layer, the source electrode and drain electrode being spaced apart by a predetermined dimension, the nitride layer extending the entire predetermined dimension between the source electrode and drain electrode; and
    forming a gate electrode on the nitride layer, wherein the nitride layer is a gate dielectric for the gate electrode.

2. The method of claim 1 further comprising forming a spacer adjacent the gate electrode and on the nitride layer.

3. The method of claim 1 wherein forming a source electrode and a drain electrode occurs prior to depositing a nitride layer and wherein depositing a nitride layer includes depositing the nitride layer on a sidewall of the source electrode and a sidewall of the drain electrode.

4. The method of claim 1 wherein the nitride layer is selected from the group consisting of aluminum nitride, silicon nitride, hafnium nitride and zirconium nitride.

5. The method of claim 1 wherein the wherein the step of forming is carried out using a pre-formed graphene.

6. The method of claim 1 wherein the graphene layer is in direct contact with the substrate and the nitride layer is in direct contact with the graphene layer.

7. A method of forming a semiconductor structure comprising:
    providing a substrate;
    forming a graphene layer on the substrate;
    depositing a nitride layer on the graphene layer;
    forming a source electrode and a drain electrode on the graphene layer, the source electrode and drain electrode being spaced apart by a predetermined dimension, the nitride layer extending at least part of the predetermined dimension between the source electrode and drain electrode; and
    forming a gate electrode on the nitride layer, wherein the nitride layer is a gate dielectric for the gate electrode and further comprising patterning the nitride layer so as to remove the nitride layer from portions of the graphene layer.

8. The method of claim 7 wherein the graphene layer is in direct contact with the substrate and the nitride layer is in direct contact with the graphene layer.

9. The method of claim 7 wherein the nitride layer is selected from the group consisting of aluminum nitride, silicon nitride, hafnium nitride and zirconium nitride.

10. The method of claim 7 wherein the wherein the step of forming is carried out using a pre-formed graphene.

11. The method of claim 7 wherein patterning comprises removing the nitride layer not covered by the gate electrode.

12. The method of claim 11 further comprising forming a spacer adjacent the gate electrode and on the graphene layer.

13. A semiconductor structure comprising:
a substrate;
a graphene layer on the substrate;
a source electrode and a drain electrode on the graphene layer, the source electrode and drain electrode being spaced apart by a predetermined dimension;
a nitride layer on the graphene layer between the source electrode and drain electrode; and
a gate electrode on the nitride layer, wherein the nitride layer is a gate dielectric for the gate electrode wherein the nitride layer extends only under the gate electrode.

14. The semiconductor structure of claim 13 further comprising a spacer adjacent the gate electrode and on the graphene layer.

15. The semiconductor structure of claim 13 wherein the graphene layer is in direct contact with the substrate and the nitride layer is in direct contact with the graphene layer.

16. The semiconductor structure of claim 13 wherein the nitride layer can be aluminum nitride, silicon nitride, hafnium nitride or zirconium nitride.

17. A semiconductor structure comprising:
a substrate;
a graphene layer on the substrate;
a source electrode and a drain electrode on the graphene layer, the source electrode and drain electrode being spaced apart by a predetermined dimension;
a nitride layer on the graphene layer between the source electrode and drain electrode, wherein the nitride layer extends the entire predetermined dimension between the source electrode and the drain electrode; and
a gate electrode on the nitride layer, wherein the nitride layer is a gate dielectric for the gate electrode.

18. The semiconductor structure of claim 17 further comprising a spacer adjacent the gate electrode and on the nitride layer.

19. The semiconductor structure of claim 17 wherein the nitride layer extends the entire predetermined dimension between the source electrode and the drain electrode and continues up a sidewall of the source electrode and a sidewall of the drain electrode.

20. The semiconductor structure of claim 17 wherein the nitride layer can be aluminum nitride, silicon nitride, hafnium nitride or zirconium nitride.

21. The semiconductor structure of claim 17 wherein the graphene layer is in direct contact with the substrate and the nitride layer is in direct contact with the graphene layer.

22. The semiconductor structure of claim 17 wherein the substrate is selected from the group consisting of a semiconductor substrate, an insulator substrate, a polymer substrate, a layered substrate and combinations of any of the foregoing substrates.

23. The semiconductor structure of claim 22 wherein the semiconductor substrate is silicon, silicon carbide, silicon germanium, germanium, a group III-V compound, or a group II-VI compound.

24. The semiconductor structure of claim 22 wherein the insulator substrate is quartz or sapphire.

25. The semiconductor structure of claim 22 wherein the polymer substrate is a polyethylene terephthalate (PET) film.

26. The semiconductor structure of claim 22 wherein the layered substrate is $SiO_2/Si$, $HfO_2/Si$, $Al_2O_3/Si$, or SOI (silicon on insulator).

* * * * *